United States Patent [19]

Suzuki

[11] Patent Number: 4,555,626
[45] Date of Patent: Nov. 26, 1985

[54] RADIATION SHIELD IN LIGHT DETECTOR AND/OR ASSEMBLY

[75] Inventor: Arata Suzuki, Ramsey, N.J.
[73] Assignee: Capintec Inc., Ramsey, N.J.
[21] Appl. No.: 404,825
[22] Filed: Aug. 3, 1982
[51] Int. Cl.$^4$ ............................................. H01J 5/02
[52] U.S. Cl. ................................... 250/239; 250/352
[58] Field of Search ............ 250/238, 239, 237, 505.1, 250/515.1, 352; 374/121, 129

[56] References Cited

U.S. PATENT DOCUMENTS

| | | | |
|---|---|---|---|
| 3,103,585 | 9/1963 | Johnson et al. | 250/83 |
| 3,114,041 | 12/1963 | Amsterdam | 250/83 |
| 3,445,659 | 5/1969 | Guimento et al. | 250/83 |
| 3,604,933 | 9/1971 | Cross et al. | 250/83 |
| 3,619,614 | 11/1971 | Yamaka | 250/83 |
| 3,963,926 | 6/1976 | Borrello | 250/338 |
| 4,005,288 | 1/1977 | Robillard | 250/239 |
| 4,063,095 | 12/1977 | Wieder | 250/338 |
| 4,262,200 | 4/1981 | Guy | 250/352 |

FOREIGN PATENT DOCUMENTS 0724936  3/1980  U.S.S.R. ............................. 250/239

*Primary Examiner*—David C. Nelms
*Assistant Examiner*—J. Gatto
*Attorney, Agent, or Firm*—Fleit, Jacobson, Cohn & Price

[57] ABSTRACT

A radiation shield in a light detector and/or sensor assembly generally comprises a horizontally oriented buffer on which the detector is disposed, a vertically oriented radiation shield surrounding the detector, and a horizontally oriented collimating buffer disposed on the vertically oriented radiation shield above the detector. Advantages of the invention include minimization of the effect of radiation emitted from the hot junctions of a thermoelectric cooler employed in the detection assembly, and the provision of an electromagnetic shield when the arrangement is connected to the low-impedance side of the amplifying circuitry associated with the detector. The buffer preferably comprises a highly emissive material, while the collimating buffer is preferably of an electrically conductive material. Electromagnetic shielding can be provided by the use of high permeability material. Finally, the shield, buffer and collimating buffer may be insulated from the detector and thermoelectric cooling elements, and may be connected to a suitable point of amplifier circuitry associated with the assembly to minimize the effect of noise from the thermoelectric cooling device.

17 Claims, 2 Drawing Figures

RADIATION SHIELD IN LIGHT DETECTOR AND/OR ASSEMBLY

BACKGROUND OF THE INVENTION

1. Field of the Invention

The present invention generally relates to a radiation shield in a light detector and/or sensor assembly.

More particularly, the invention relates to the use of a shielding arrangement comprising the combination of a radiation shield, a buffer, and a collimating buffer.

2. Description of the Prior Art

Some types of light detectors or sensors must be cooled in order to be useful. Other types of detectors or sensors are often cooled to improve their ability to detect (their sensitivity) or to improve their stability by reducing the noise level and/or maintaining a stable environment. As is known, cooling is more important in the infrared region of light wave detection or measurement.

In the prior art, single- or multiple-stage thermoelectric cooling devices or liquid nitrogen have often been used to cool detectors or sensors.

In light detectors or sensors, a critical consideration is the noise level encountered in the course of detection or measurement. The source of the noise is dependent upon the type of detector or sensor in use, as well as the design of the detection or measurement instrument and/or the nature of the object being monitored or measured.

A problem which arises in the prior art technology relates to the fact that, by cooling alone, one may still not be able to reduce the noise level of the detector or sensor to a desirable level. Such a problem is encountered when the noise source is light radiation characterized by a wavelength within the detector's sensitive wavelength region. Such light radiation may be generated from other parts of the instrument, or may comprise scattered radiation from an optical system.

Accordingly, it is considered desirable, in light of the prior art, to design a cooling mechanism which not only provides for cooling of the detector, but also provides shielding against any stray radiation. Ideally, the temperature of such a shield should be kept near the detector's temperature.

When a thermoelectric cooling device is used as a cooling media, the high temperature junction of the cooler is often in the same detector or sensor package. Moreover, the temperature of the enclosing case is often as high as that of the high temperature junction of the cooler.

Furthermore, radiated light from the hot junction or base plate is often scattered by the assembly enclosure, by the window of the detector assembly, or by the components outside of the assembly package, and this radiation is detected by the sensor or detector. This contributes to the noise level experienced with respect to the detector or sensor.

In addition, if one increases the current applied to a thermoelectric cooling device (for example, in order to improve the ability of the detector to detect), more heat will be generated at the hot junction of the cooling device. Unless the heat dissipating capability of the base plate of the assembly is improved as the current is increased, the case temperature will rise by a considerable amount, and the noise level may be increased.

The resulting radiation not only reduces the ability of the detector or sensor to detect, but also can induce erroneous results. For example, in a two-color pyrometer, one must measure the intensity ratio of radiation emitted from a target in two wavelength regions. If the optical system is such that only one wavelength region of light from the hot junction of the thermoelectric cooler is reflected into the sensor by the filter of the instrument, the measured result is incorrect.

Accordingly, it is considered desirable to develop a radiation shield for use within a sensor or detector assembly, wherein radiation from the hot junction of the cooler, radiation from the enclosure, and/or radiation from other than the target, which enters into the sensor or detector assembly, can be minimized. Furthermore, it is considered desirable to develop a radiation shield for use in a sensor or detector assembly, wherein electromagnetic noise associated with the thermoelectric cooler does not adversely affect the very low-level high-impedance signal generated by the detector when a relatively unstable and high current is applied to the cooler.

SUMMARY OF THE INVENTION

The present invention generally relates to a radiation shield in a light detector and/or sensor assembly, and more particularly to the use of a shielding arrangement comprising the combination of a radiation shield, a buffer and a collimating buffer.

As a result of the shielding arrangement of the present invention, at least two beneficial results are achieved: firstly, minimization of the effect of radiation emitted from the hot junctions of the thermoelectric cooler, base plate and enclosing case of the assembly is achieved; and, secondly, an electromagnetic shield is provided, so that the arrangement is connected to the low-impedance side of the amplifying circuit of the instrument.

In a preferred embodiment, the buffer preferably comprises a highly emissive material, while the collimating buffer is preferably of an electrically conductive material.

Moreover, the electromagnetic shielding is preferably provided by a high permeability material.

Furthermore, the shield, buffer and collimating buffer are preferably insulated from the detector and the thermoelectric cooling elements, and are preferably connected to a suitable point of the amplifier circuitry so as to minimize the effect of noise from the thermoelectric cooling device.

Therefore, it is an object of the present invention to provide a radiation shield in a light detector and/or sensor assembly.

It is an additional object of the present invention to achieve minimization of the effect of radiation emitted from the hot junctions of the thermoelectric cooler, base plate and enclosing case of the light detector and/or sensor assembly.

It is an additional object of the present invention to provide an electromagnetic shield when the arrangement is connected to the low-impedance side of the amplifying circuit of the instrument.

It is an additional object of the present invention to provide a buffer comprising a highly emissive material.

It is an additional object of the present invention to provide a collimating buffer which is preferably of an electrically conductive material.

It is an additional object of the present invention to provide a high permeability material for electromagnetic shielding.

It is an additional object of the present invention to provide insulation of the shield, the buffer and the collimating buffer from the detector and the thermoelectric cooling elements.

Finally, it is an additional object of the present invention to provide connection of the shield, the buffer and the collimating buffer to a suitable point of the amplifier circuitry to minimize the effect of noise from the thermoelectric cooling device.

The above and other objects that will hereinafter appear, and the nature of the invention, will be more clearly understood by reference to the following description, the appended claims, and the accompanying drawings.

DETAILED DESCRIPTION

The invention will now be more fully described with reference to FIG. 1, which is a diagrammatic representation of a known light detector and/or sensor assembly.

Figure 1:
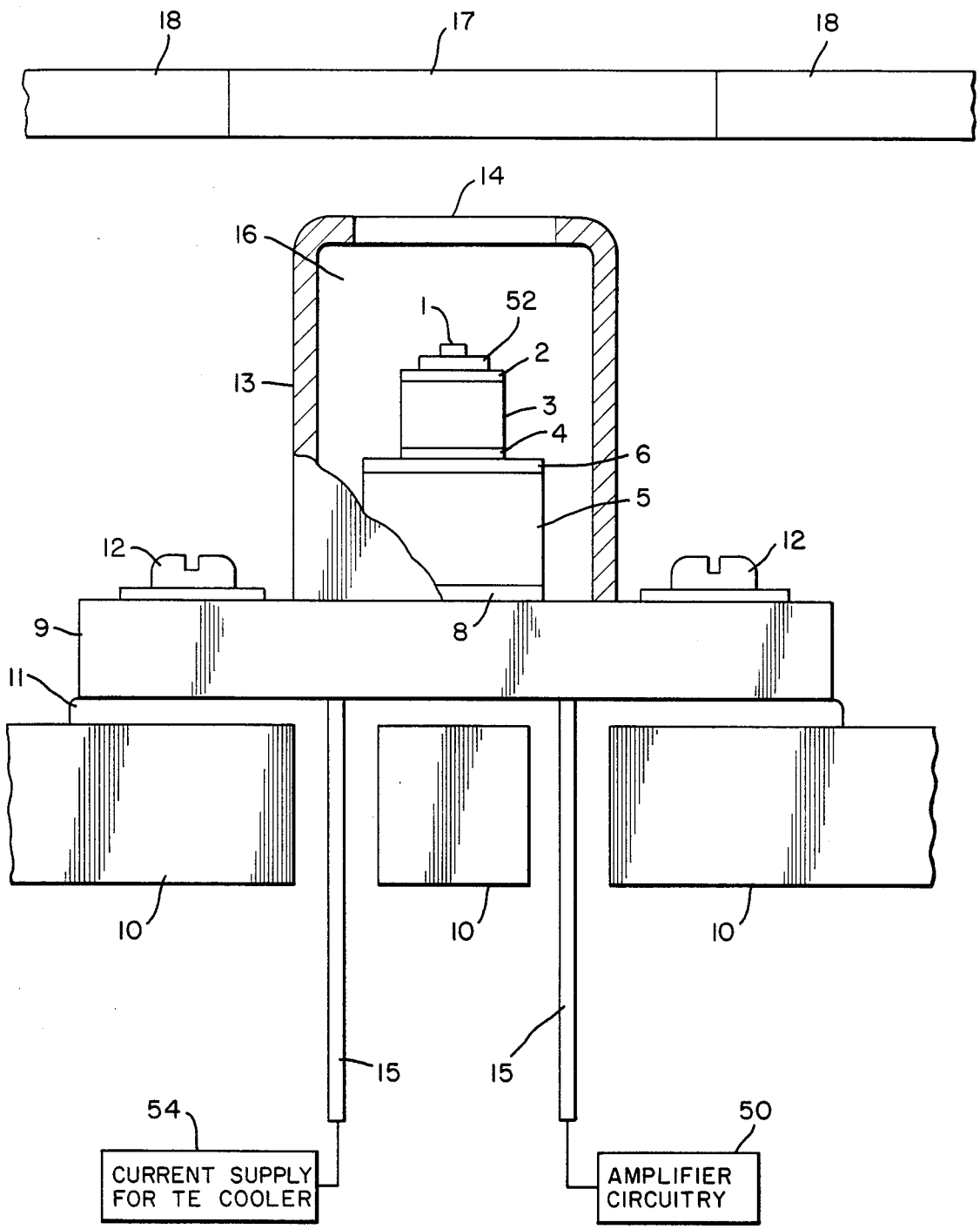
FIG. 1 is a diagrammatic representation of a conventional light detector and/or sensor assembly.

As seen in FIG. 1, the light detector and/or sensor assembly comprises the following elements: a detector element 1 (for example, of the lead sulfide type) mounted on substrate 52, a cold junction 2, a second-stage thermoelectric cooler 3, a hot junction 4, a first-stage thermoelectric cooler 5, a cold junction 6 of the first-stage cooling device 5, a hot junction 8 of the first-stage cooling device 5, a base plate 9, heat sinks 10, thermoconductive paste 11, mounting screws 12, enclosing case 13 with an enclosed volume 16, a window 14, lead wires 15, schematically coupling amplifier 50 and the current supply 54 for the thermoelectric (TE) cooler and a filter 17 associated with a filter wheel 18.

Further referring to FIG. 1, the lead sulfide detector, which includes detector 1 and substrate 52, is mounted on the cold junction 2 of the second-stage thermoelectric cooling device 3. The hot junction 4 of the second-stage thermoelectric cooling device 3 is mounted on the cold junction 6 of the first-stage cooling device 5. The hot junction 8 of the first-stage cooling device 5 is mounted on the base plate 9.

The base plate 9 is then thermo-conductively cooled by the heat sink 10 of the assembly. That is, the heat sink 10 is cooled by convection or conduction, whichever comprises a suitable means for the particular instrument being employed.

Thermoconductive paste 11 is applied between the base plate 9 and the heat sink 10, and mounting screws 12 are used to clamp the base plate 9 on the heat sink 10.

Enclosing case 13 with light-transmissive window 14 encloses the two-stage thermoelectrically cooled lead sulfide detector. Electrical connections to the detector 1 and the thermoelectric cooling devices 3 and 5 are made through hermetically shielded lead wires 15, which enter through the base plate 9. An amplifier 50 is coupled to detector as is well known in the art.

The enclosed volume 16 is kept in a vacuum so that no condensation of water on the surface of the detector 1 occurs, and so that heat loss due to convection is kept to a minimum.

Infrared radiation emitted from the hot junctions 4 and 8 of the cooler, the base plate 9, and the case 13 can, without shielding, strike the lead sulfide detector 1. Moreover, infrared radiation emitted from the sources mentioned above could also be reflected by an external surface, such as the filter 17 and/or filter wheel 18, and then strike the lead sulfide detector 1. Furthermore, electromagnetic noise associated with the thermoelectric cooler could have a harmful effect on the very low-level high-impedance signal at the detector 1, since relatively unstable high current is applied to the cooler.

As mentioned above, when (as in FIG. 1) a thermoelectric cooling device 3, 5 is used as a cooling media, the high temperature junction of the cooler is often in the same detector or sensor package. This can be seen by reference to the hot junctions 4 and 8 in the prior art arrangement shown in FIG. 1. As a result, the temperature of the enclosing case 13 is often as high as that of the high temperature junctions 4 and 8 of the cooler 5.

Furthermore, radiated light from the hot junctions 4 or 8, or from the base plate 9, is often scattered by the enclosure 13, by the window 14, or by the components outside of the assembly package (such as the filter 17 and/or filter wheel 18, mentioned above), and is detected by the detector 1. This contributes to a noise level experienced by the detector 1.

If, in order to improve the ability of the detector 1 to detect, the current applied to the thermoelectric cooling device 3, 5 is increased, more heat will be generated at the hot junctions 4, 8. Unless a heat dissipating capability of the base plate 9 is improved as the cooler current is increased, the temperature of the case 13 will rise. This will result in an increase in the noise level.

Such type of radiation not only reduces the ability of the detector or sensor to detect, but also can produce erroneous results in the data obtained from operation of the device. For example, as mentioned above, in a two-color pyrometer, one must measure the intensity ratio of radiation emitted from a target in two wavelength regions. If the optical system is such that only one wavelength region of light from the hot junction of the thermoelectric cooler is reflected into the sensor by the filter of the instrument, the measured result is incorrect.

Accordingly, it is deemed highly desirable to provide a radiation shield within the sensor or detector assembly, such that radiation from the hot junctions 4, 8 of the cooler 3, 5, radiation from the enclosure 3, or radiation from sources other than the target, can be minimized.

Figure 2:
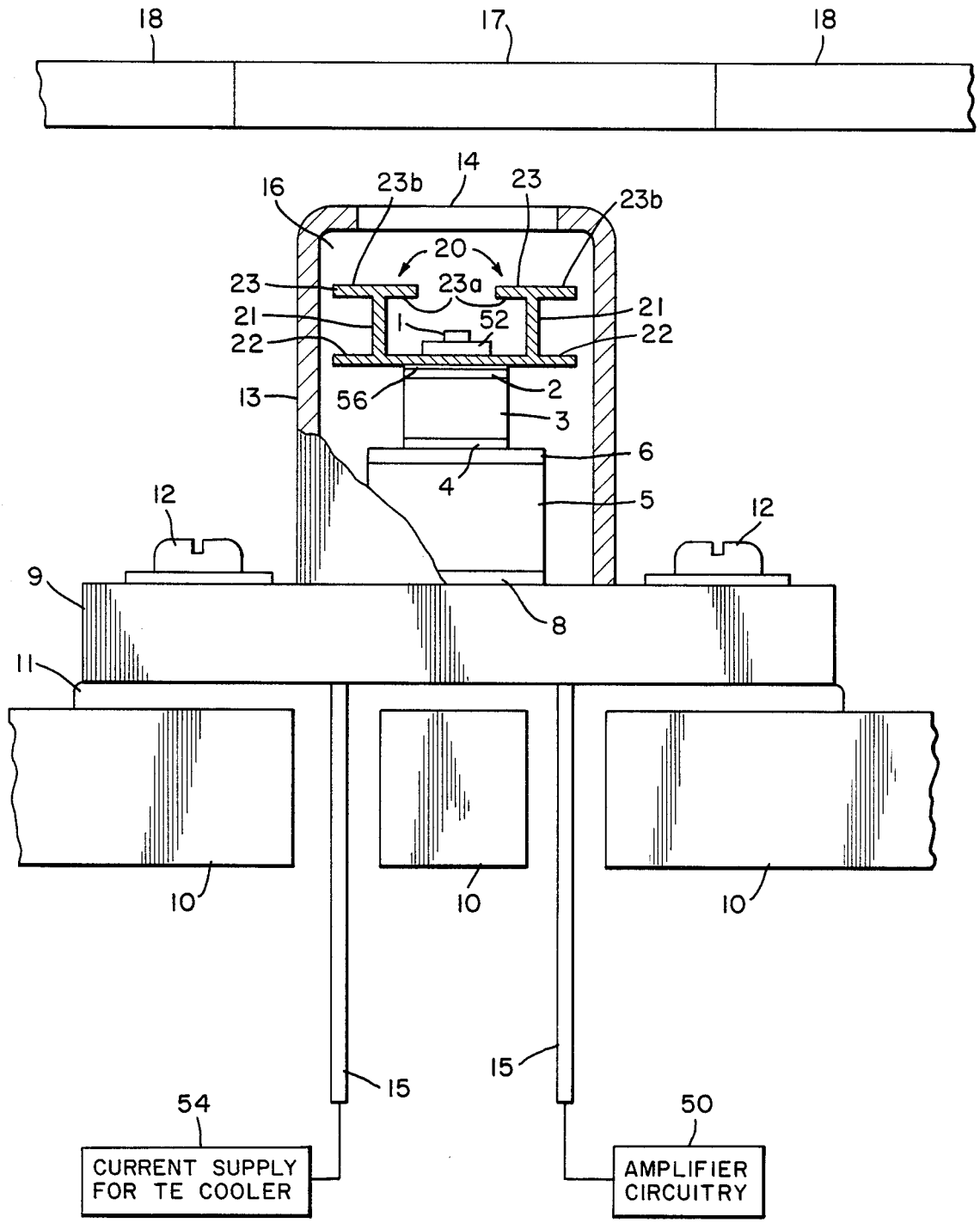
FIG. 2 is a diagrammatic representation of the employment of the inventive radiation shield in a light detector and/or sensor assembly.

FIG. 2 is a diagrammatic representation of the present invention, and more particularly is a diagrammatic representation of a radiation shield in a light detector and/or sensor assembly. In view of the similarity between FIGS. 1 and 2, like reference numerals have been maintained where appropriate.

As seen in FIG. 2, the inventive arrangement further comprises a radiation shield arrangement generally indicated by the reference numeral 20. The inventive radiation shield arrangement 20 comprises a first radiation shield 23 (sometimes called collimating buffer 23), a second radiation shield 21 (sometimes called shield 21) and a third shield 22 (sometimes called buffer 22). As illustrated in FIG. 2, the first or collimating shield 23 has portions 23a and 23b extending inwardly and outwardly with respect to shield 21 and detector 1. Outwardly extending portions 23b prevent upwardly directed radiation, originating, e.g., from hot junctions 4 or 8 and scattered by enclosure 13, from affecting detector 1.

More particularly, the radiation shield arrangement 20 includes a buffer 22 disposed on the cold junction 2 of the second-stage thermoelectric cooler 3, a radiation shield vertically disposed on the buffer 22, and a collimating buffer 23 disposed horizontally on the radiation shield 21.

As seen in FIG. 2, the detector 1 is disposed within an enclosure formed by the radiation shield 21, buffer 22 and collimating buffer 23. The radiation shield 21, buffer 22 and collimating buffer 23 not only minimize the effect of radiation emitted from the hot junctions 4, 8 of the cooler 3, 5, the base plate 9, and/or the case 13, but also act as an electromagnetic shield when they are connected properly to the low-impedance side of the amplification circuitry (such as amplifier 50) associated with the instrument.

In a preferred embodiment, the surface of the radiation shield 21, buffer 22 and collimating buffer 23 are highly emissive so as to minimize the effect of radiation. Both the inside and outside surfaces of the enclosing case 13 also, preferably, are highly reflective (that is, of low emissivity), so as to minimize radiation from the surfaces.

The radiation shield 21, buffer 22, and collimating buffer 23 are preferably of electrically conductive material, and are also preferably electrically connected to each other. In order to shield the detector 1 effectively from electromagnetic field radiation, high permeability material (such as mu-metal) is used.

The radiation shield 21, buffer 22 and collimating buffer 23 are also preferably insulated from the detector 1 (by substrate 52) and the thermoelectric cooling elements 3, 5, (by electrical insulator 56) and are connected to suitable points of amplification circuitry associated with the instruments so as to minimize the effect of noise from the thermoelectric cooling devices 3, 5, as well as from the other noise sources.

While preferred forms and arrangements have been shown in illustrating the invention, it is to be clearly understood that various changes in detail and arrangement may be made without departing from the spirit and scope of this disclosure.

What is claimed is:

1. A radiation shield for use with a detector disposed in and defining a first horizontal plane, a thermoelectric cooler adapted to cool said detector, a case enclosing a volume of space about said detector and said cooler, a light-transmissive window in said case adapted to admit radiation into the enclosed volume and onto said detector, means for electrically coupling said detector and said cooler to respective external circuitry, said shield comprising:
   a first shield means being disposed in a second horizontal plane parallel to and vertically spaced from said detector and said first horizontal plane, and disposed within said enclosed volume, said first shield means having an opening therein to allow the radiation admitted through said light-transmissive window to impinge on said detector;
   a second shield means extending vertically between the first and second horizontal planes; and
   said first shield means having portions extending both inward and outward with respect to said detector and said second shield means;
   whereby to shield said detector from radiation not admitted through said light-transmissive window.

2. The shield of claim 1, including a third shield means disposed in a third horizontal plane below said detector and said first horizontal plane and being substantially flat, and said second shield extending vertically between said second and third horizontal planes.

3. The shield of claim 1, wherein said second shield means is a vertically disposed radiation shield surrounding said detector.

4. The shield of claim 3, wherein said detector is disposed on said third shield means and wherein said vertically disposed radiation shield is positioned on said third shield means.

5. The shield of claims 3 or 4, wherein said first shield means is a collimator to said radiation.

6. The shield of claim 1, wherein said first shield means is made of an electrically conductive material.

7. The shield of claim 2, wherein said third shield means is made of a highly emissive material.

8. The shield of claim 2, wherein said second and said third shield means is electrically insulated from the detector.

9. A detection assembly comprising:
   a radiation detector disposed in a first horizontal plane;
   thermoelectric cooler adapted to cool said detector;
   a case enclosing a volume of space about said detector and said cooler;
   a light-transmissive window in said case adapted to admit radiation into the enclosed volume and onto said detector;
   means for electrically coupling said detector and said cooler to respective external circuitry;
   a first shield means disposed within said enclosed volume in a second horizontal plane parallel to and vertically spaced from said detector and said first horizontal plane, said first shield means having an opening therein to allow radiation admitted through said light-transmissive window to impinge on said detector; and
   a second shield means disposed within said enclosed volume extending vertically between said first and second horizontal planes.

10. The detection assembly of claim 9, including a third shield means disposed in a third horizontal plane below said detector and said first horizontal plane and being substantially flat, and said second shield extending vertically between said second and third horizontal planes, and wherein said third shield means is electrically insulated from the detector.

11. The detection assembly of claim 10, wherein said third shield means is electrically insulated from the thermoelectric cooler.

12. The detection assembly of claim 10, including amplifier circuitry as part of said external circuitry connected to the coupling means and said detector, said first, second and third shield means being connected electrically to said amplifier circuitry, whereby to minimize noise effect.

13. A detection assembly as recited in claim 9, said thermoelectric cooler having a cold junction, and said third shield means disposed between said cold junction and said detector.

14. A detection assembly as recited in claim 9, wherein said first shield means is a collimator to said radiation and is disposed between said detector and said window.

15. A radiation shield as recited in claim 5, wherein said first, second and third shield means is made of a highly permeable material, whereby to provide electromagnetic shielding.

16. A radiation shield as recited in claim 5, said detector being coupled to amplification circuitry via said coupling means, wherein said first, second and third shield means are connected to said amplification circuitry, whereby to minimize noise.

17. An apparatus as recited in claims 2 or 7, wherein said third shield means includes portions extending outwardly with respect to said detector beyond said second shield means.

* * * * *